(12) United States Patent
Ralph

(10) Patent No.: US 6,188,012 B1
(45) Date of Patent: Feb. 13, 2001

(54) METHODS AND SYSTEMS FOR A SOLAR CELL CONCENTRATOR

(75) Inventor: Eugene L. Ralph, San Gabriel, CA (US)

(73) Assignee: Tecstar Power Systems, City of Industry, CA (US)

( * ) Notice: Under 35 U.S.C. 154(b), the term of this patent shall be extended for 0 days.

(21) Appl. No.: 09/437,869

(22) Filed: Nov. 10, 1999

(51) Int. Cl.[7] .................. H01L 31/045; H01L 31/042; H01L 31/18; B64G 1/44

(52) U.S. Cl. .................. 136/246; 136/292; 136/291; 136/259; 136/245; 244/173; 438/66; 438/69; 438/72; 438/73; 438/80; 257/432

(58) Field of Search .................. 136/292, 291, 136/246, 259, 245; 126/624, 696, 697, 683; 244/173; 438/66, 69, 72, 73, 80; 257/432; 359/850, 853, 851, 871, 872, 877

(56) References Cited

U.S. PATENT DOCUMENTS

| | | | |
|---|---|---|---|
| 3,125,091 | * 3/1964 | Sleeper, Jr. .................. | 126/624 |
| 3,232,795 | * 2/1966 | Gillette et al. .................. | 136/246 |
| 5,244,508 | * 9/1993 | Colozza .................. | 136/292 |
| 5,496,414 | * 3/1996 | Harvey et al. .................. | 136/246 |
| 5,520,747 | * 5/1996 | Marks .................. | 136/292 |
| 5,578,139 | * 11/1996 | Jones et al. .................. | 136/292 |
| 5,660,644 | * 8/1997 | Clemens .................. | 136/246 |

* cited by examiner

Primary Examiner—Alan Diamond
(74) Attorney, Agent, or Firm—Knobbe, Martens, Olson & Bear, LLP

(57) ABSTRACT

One embodiment of the present invention is a solar cell array intended for use in space. The solar cell array includes a lightweight, compressible concentrator which can be efficiently deployed. The solar cell array includes a first column of solar cells and a second column of solar cells. A reflective concentrator may be positioned between the first column of solar cells and the second column of solar cells. The reflective concentrator may include a thin film material, where the reflective concentrator is compressible to a first height when in the stowed position. A spring may be coupled to the concentrator, wherein the spring urges the reflective concentrator to a second height when the reflective concentrator is deployed.

41 Claims, 7 Drawing Sheets

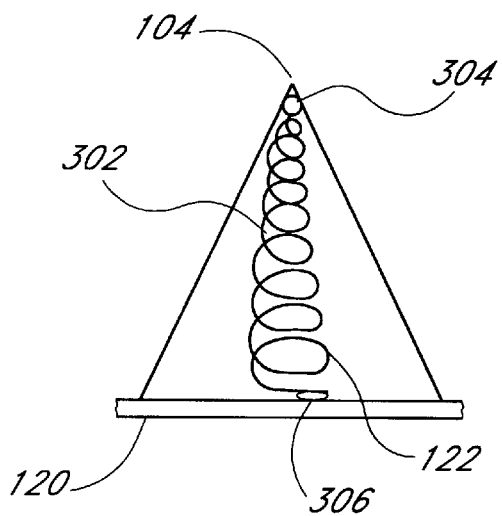
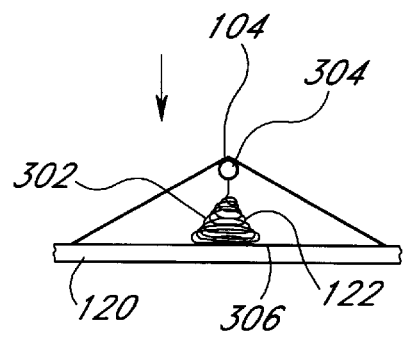
FIG.3A  FIG.3B
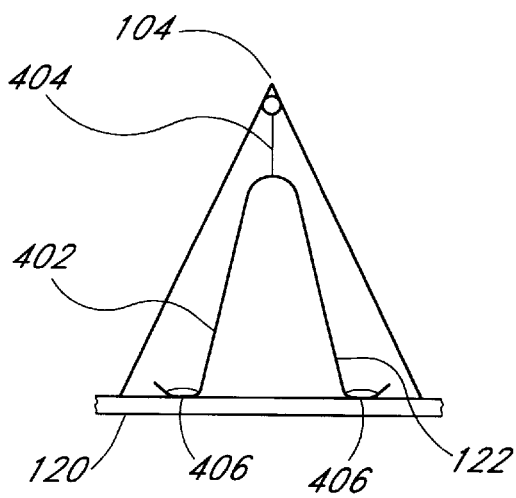
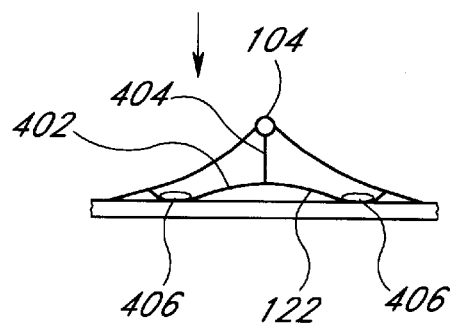
FIG.4A  FIG.4B

METHODS AND SYSTEMS FOR A SOLAR CELL CONCENTRATOR

BACKGROUND OF THE INVENTION

1. Field of the Invention

The present invention relates to solar cells. In particular, the invention relates to methods and apparatuses for solar cell concentrator arrays.

2. Description of the Related Art

Photovoltaic cells, commonly called solar cells, are well-known devices which convert solar energy into electrical energy. Solar cells have long been used to generate electrical power in both terrestrial and space applications. Solar cells offer several advantages over more conventional power sources. For example, solar cells offer a clean method for generating electricity. Furthermore, solar cells do not have to be replenished with fossil fuels. Instead, solar cells are powered by the virtually limitless energy of the sun.

In space applications, hundreds or thousands of the small solar cells are interconnected together to form large solar arrays. To increase the amount of power generated from these arrays, concentrators are often used. Concentrators increase the amount of light that falls on the array solar cells, which in turn generate increased electrical power.

Conventional concentrators often are implemented as reflectors. However, these conventional reflectors typically suffer from significant limitations. Conventional reflectors tend to be expensive, heavy, and hard to stow and deploy. Additionally, using one conventional technique, reflectors are positioned around the array, thereby causing reflected light to fall upon different cells with different intensities, causing solar cell hot spots. These hot spots may have to be cooled using complicated and heavy cooling mechanisms, such as heat pipes. Because of the great expense associated with lifting each pound of material into space, the real costs associated with these heavy systems are significant.

Using another conventional technique, rigid, thick reflectors, permanently extending two or more inches above the solar cells, may be placed at several locations on a solar cell array. This technique disadvantageously requires a great deal of stow room due to the height of the reflectors. Furthermore, the thick, heavy reflectors add significant weight to the array.

Still other conventional concentrator techniques use lenses positioned over the solar cells. These lenses may be relatively expensive and thick, and so disadvantageously add weight and height to the array panel. Lenses also require a relatively high degree of pointing accuracy to ensure that the solar cells receive the desired degree of focused light.

SUMMARY OF THE INVENTION

One embodiment of the present invention is a solar cell concentrator array suitable for use in space. In one embodiment, the concentrator is distributed throughout all or portions of the array and is compressible. By compressing the concentrator for stowage, the overall volume needed to store the array is advantageously significantly less than that needed for arrays using conventional concentrators.

In one embodiment, the novel concentrator configuration automatically deploys using an expansion device, such as one or more spring assemblies, during a conventional rigid or flexible array panel deployment. Thus, the need for off-panel storage areas and/or complex deployment mechanisms are thereby advantageously reduced or eliminated.

In addition, in one embodiment, the concentrator configuration is of low mass. For example, in one embodiment, the concentrator is formed from a thin film material, thereby greatly reducing the weight of the concentrator. For example, the concentrator may be formed using a reflective polymide material or a fluorocarbon material.

Because one embodiment of the novel concentrator is distributed over the array, this concentrator configuration provides relatively even distribution of the thermal load due to reflected light, and since the average energy in one embodiment approximates the average energy of a non-concentrator array, further ensures that the maximum temperature of the array solar cells is not excessive.

Furthermore, in one embodiment, the distributed concentrator configuration enhances overall panel reliability since the failure of one concentrator assembly affects only the solar cells local to the failed concentrator assembly. In addition, in one embodiment, the pointing accuracy needed is reduced as compared to many conventional concentrator designs, reducing costs associated with alignment. Further, one embodiment of the present invention allows the structural flatness of the array to be maintained.

One embodiment of the present invention is a solar cell array intended for use in space. The solar cell array includes a lightweight, compressible concentrator which can be reliably and efficiently deployed. The solar cell array includes a first column of solar cells and a second column of solar cells. A reflective concentrator may be positioned between the first column of solar cells and the second column of solar cells. The reflective concentrator may include a thin film material, where the reflective concentrator is compressible to a first height when in the stowed position. A spring may be coupled to the concentrator, wherein the spring urges the reflective concentrator to a second height when the reflective concentrator is deployed.

Another embodiment of the present invention is a method of assembling a solar cell array. A first column and a second column of solar cells is provided on an array panel. A reflective concentrator formed at least partly from thin film material is provided as well. The reflective concentrator is positioned between the first column of solar cells and the second column of solar cells. The reflective concentrator is compressible to a first height for stowing and extends to a second height for deployment.

BRIEF DESCRIPTION OF THE DRAWINGS

These and other aspects, advantages, and novel features of the invention will become apparent upon reading the following detailed description and upon reference to accompanying drawings in which:

FIGS. 3A–3B illustrate a second embodiment of the deployment mechanism;

FIGS. 4A–4B illustrate a third embodiment of the deployment mechanism;

DETAILED DESCRIPTION OF PREFERRED EMBODIMENTS

As will be discussed in greater detail below, the present invention is related to a novel concentrator configuration for use with a solar cell array. The novel concentrator provides many advantages and is particularly suitable for use in space. In one embodiment, the concentrator may be compressed or collapsed for storage and is distributed throughout all or a portion of the array. Furthermore, in one embodiment, the novel compressible concentrator configuration may automatically deploy or "pop-up" during a conventional deployment of a rigid or no-rigid array panel, thereby reducing or eliminating the need for off-panel storage areas and/or other complex and unreliable deployment mechanisms.

Furthermore, the distributed configuration provides relatively even distribution of the thermal load due to reflected light, and reduces or eliminates hot spots. In addition, because, in one embodiment, the concentrator is distributed and modular, the overall panel reliability is enhanced since the failure of one concentrator assembly affects only the solar cells local to the failed concentrator assembly.

Furthermore, in one embodiment, the pointing accuracy needed is reduced as compared to many conventional concentrator designs.

Figure 1A:
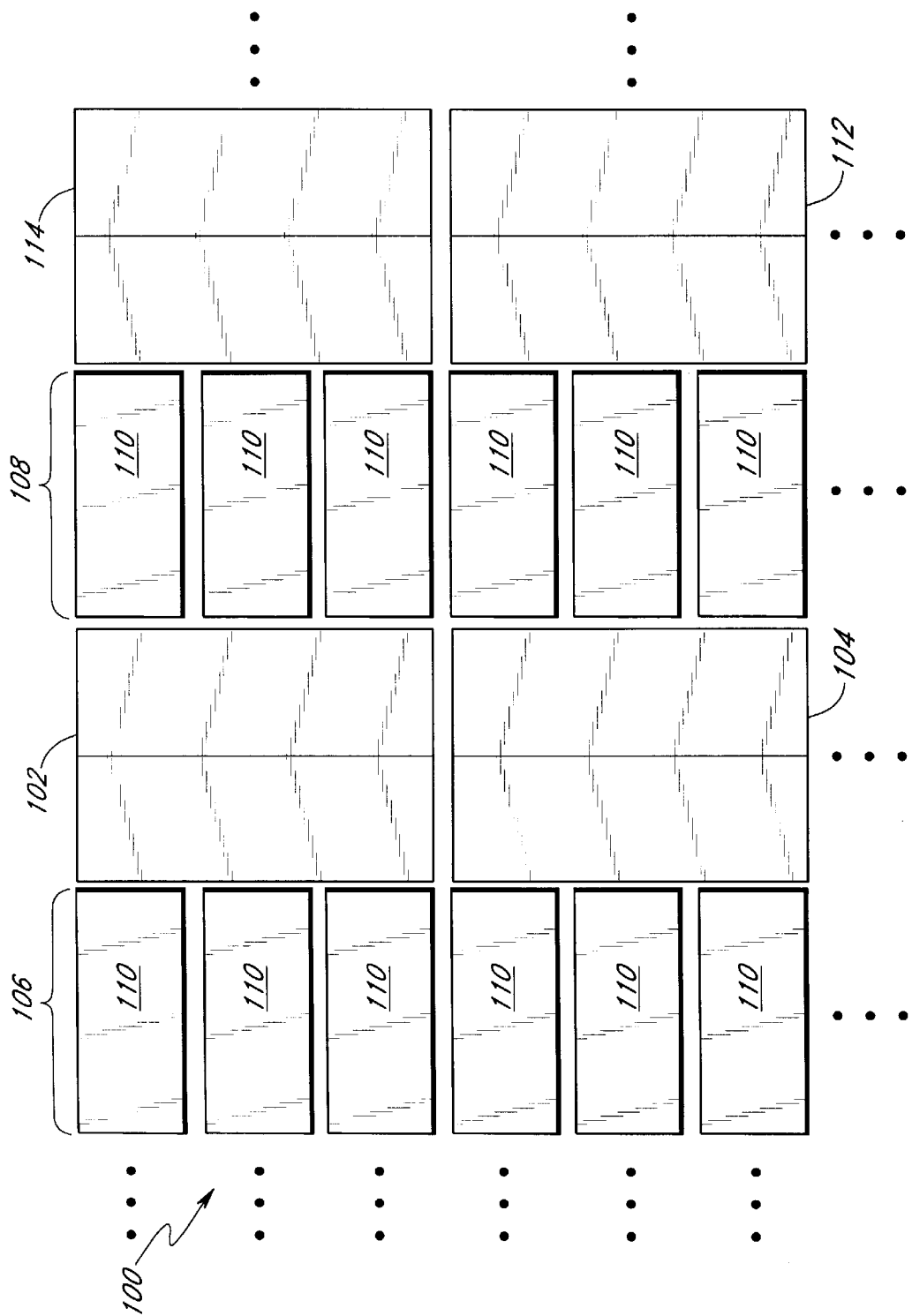
FIG. 1A illustrates top plan view of one embodiment of a portion of a solar cell array incorporating one embodiment of the present invention.
Figure 1B:
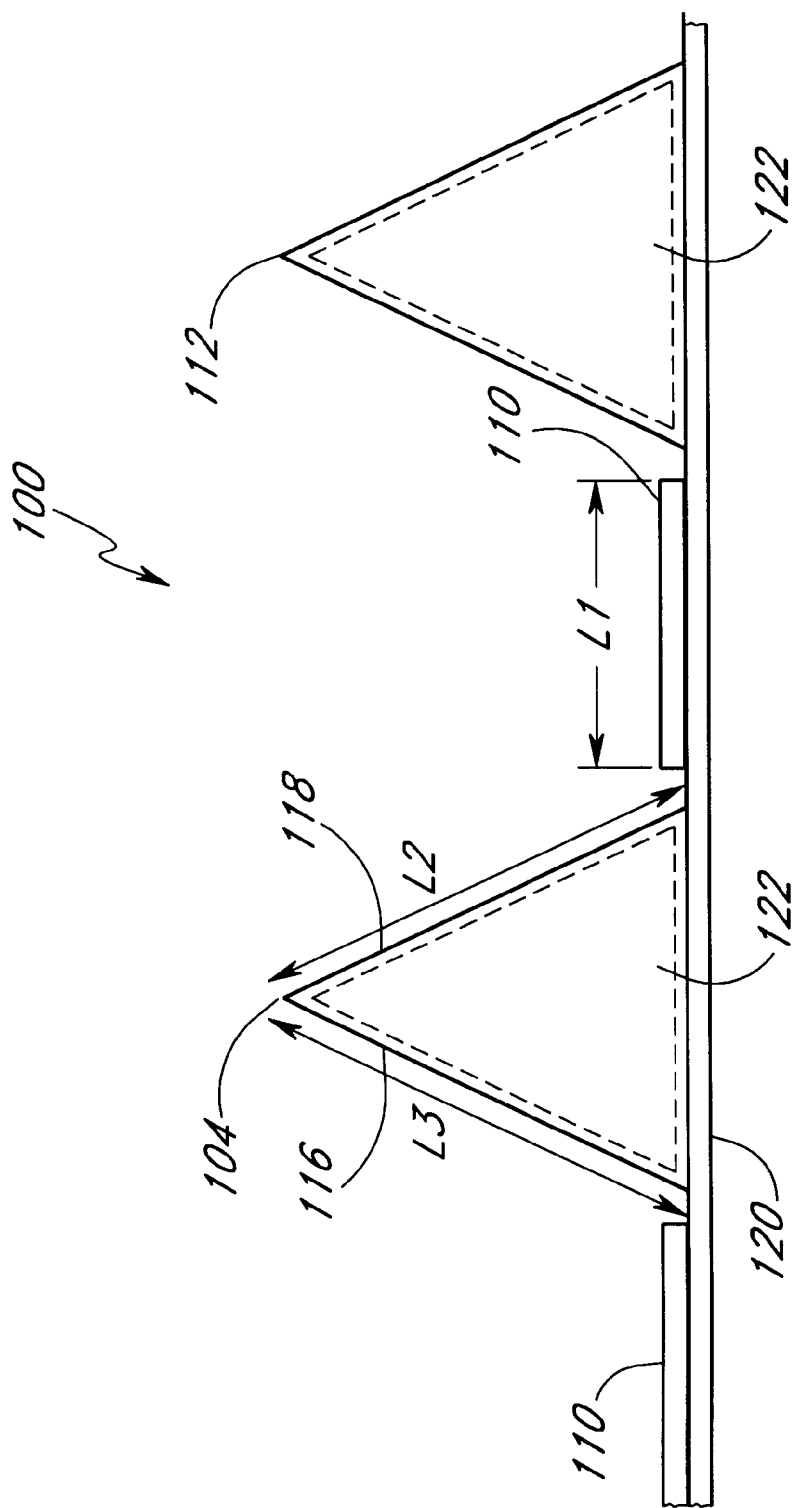
FIG. 1B illustrates a front elevational view of the embodiment illustrated in FIG. 1A.

FIGS. 1A and 1B, illustrate a portion of an exemplary solar cell array 100 incorporating one embodiment of the present invention. The array 100 includes columns or strings of solar cells 106, 108, interleaved with modular concentrator assemblies 102, 104, on one or more array panels. This pattern may be repeated over all or some of the array 100, forming a series of linear troughs, where the solar cells form the bottom of each trough and the walls of the concentrators form the trough walls. The concentrator assemblies 112, 114 may be followed by an additional column of solar cells, which in turn is followed by additional concentrator assemblies, and so on, across all or part of the array panel. Thus, in one embodiment, each solar cell may have a concentrator positioned on two sides of the solar cell, ensuring an even distribution of reflected light upon the cell. However, one embodiment may use a concentrator which reflects light off only one side onto one or more solar cells positioned adjacent to that one side.

The array 100 may be connected to and used to power a satellite or other equipment located in outer space, such as in Earth or AM0 orbit. Typically, a satellite array includes several panels, which are stowed by stacking and/or folding the panels for launch. In some embodiments, each array is composed of several rigid hinged portions or panels which fold for storage. Alternatively, the array may include panels whose substrates may be formed of a flexible material, such as polymide, which folds like an accordion door in the stowed position. The arrays are then deployed once the satellite is placed in space.

In the illustrated embodiment, each concentrator has a length substantially equal to the width of three solar cells 110. However, in other embodiments, a concentrator may have greater or lesser lengths. For example, the concentrator assembly may extend substantially the entire length of the solar cell column or the width of one solar cell, or may have still other dimensions. Similarly, in the illustrated embodiment, the concentrators 102, 104, 112, 114 have a width approximately equal to the length of the solar cell 110, though other widths may be used as well.

In one embodiment, the array 100 may be a conventional rigid or flexible flat panel design enhanced to incorporate the novel concentrator configuration. Thus, for example, every other column or string of solar cells is "replaced" with a concentrator which thereby eliminates the cost and mass associated with the missing or replaced solar cells. In one embodiment, this arrangement provides a geometrical concentrator ratio of 2.5×, and an energy ratio of 2×. The energy ratio may vary depending on the geometric ratio, concentrator reflectivity, the shape of the reflector walls, and so on. However, with appropriate adjustment to the dimensions of concentrator geometric ratios, such as by adjusting concentrator width and height, the concentrators may be distributed at less frequent intervals. For example, a concentrator column may be provided for every two columns of solar cells, that is, two adjacent columns of solar cells may be provided, with a concentrator column positioned on either side of the two columns of solar cells. However, as the number of solar cells between concentrators increases, the risk of non-uniform distribution of light and hot spots may increase as well.

In one embodiment, the basic concentrator configuration is a tent-shaped or triangular structure with substantially flat walls made from low mass reflector film material. In another embodiment, the tent-shaped structure may have curved walls. By way of example, the thin film material may be a polymide material with a reflective material, such as aluminum, silver, or gold, deposited thereon. Other materials, such as thin film flurocarbon or polyester, may be used as well. In one embodiment, the thin film material may overlay a stiffening and/or tear resistant material, such as a fiberglass mesh. The resulting array is much lighter than the same size conventional array, where all the columns are strings of solar cells, yet can provide the same amount of power. In one embodiment, the power-to-mass ratio of an array using the present invention is over 20% improved as compared to the conventional array. However, the improvement in the power-to-mass ratio may vary depending on concentrator geometric ratios, shape of the concentrator walls, concentrator reflectivity, and other design considerations. The effect of various geometric ratios on concentrator performance is described in greater detail below. Thus, in another embodiment, the improvement is at least 23% better. In still another embodiment, the improvement in the power-to-mass ratio is at least 25% better. Thus, these exemplary embodiments provide significant improvement in the power-to-mass ratio as compared to many conventional designs.

Furthermore, in the embodiment described above, the operating temperature is substantially the same as for a comparable heavier, costlier conventional reflectorless flat panel solar cell array which provides the same power with the same panel area and same input energy.

FIG. 1B illustrates an elevational view of the concentrators of FIG. 1A in the deployed position. As can be seen, in one embodiment, the deployed concentrators are triangular or tent-shaped, though in other embodiments, other shapes, such as curved or parabolic shapes, may be used as well. If the concentrators are triangular-shaped, they may be in the form of an isosceles triangle or an equilateral triangle.

If the concentrator is used to illuminate solar cells on only one side of the concentrator, which might occur if the concentrator is positioned along an edge of the array, the concentrator may be substantially shaped like a right angle triangle, with only the angled wall being reflective. Thus, in one embodiment, the concentrator may only reflect light to one side.

In one embodiment, the dimension L2 of the concentrator wall 116 is substantially equal to the dimension L3 of the concentrator wall 118. In one embodiment L2=L3=6 cm. Furthermore, the width L1 of the solar cell 110 may also be equal to L2. This relationship of L1, L2, L3 provides for an even and adequate reflection of sunlight upon the adjacent solar cells, thereby reducing or eliminating undesirable hot-spots. Other embodiments may have different dimensions, and the relationship between L1, L2, and L3 may be different as well. For example, if the ratio of solar cell columns to concentrator columns were doubled, the height of the concentrators may be doubled as well to ensure that reflected light adequately reaches solar cells positioned further from the concentrators.

In the exemplary embodiment, the solar cells 110 and the concentrator assemblies 104, 112 may be mounted directly on a rigid substrate 120, such as a conventional aluminum honeycombed panel, or on a material, such as polymide, overlaying the substrate 120. Deployment or expansion devices 122 may be positioned within the tent-shaped structure to deploy the concentrators, as discussed below. In other embodiments, the deployment device 122, may be one or more superstructures positioned outside of and attached to the concentrators.

As illustrated in FIG. 1B, the edge of the concentrator film may be glued down underneath the adjacent solar cells, thereby ensuring that the concentrator is adequately mounted to the substrate 120. In another embodiment, the concentrator film may be folded underneath the deployment device 122 positioned within the tent-like structure, and bonded to the substrate 120. In still another embodiment, the concentrator material which forms the concentrators 104, 112 may include a single sheet of material underlying the solar cells 110, with enough slack left between the cells 110 to form the tent-like concentrator structures 104, 112.

In one embodiment, the array concentrators are collapsed, compressed and/or retained for launch. The compression may be provided by the mass or force of a spaceship structure, such as an adjacent array or folded portion of the same array while in the stowed position. During or after array deployment the retaining mass or force is removed and the concentrators are pushed, pulled, or otherwise positioned into the deployed position by a deployment device, such as deployment device 122. As will be discussed in greater detail below, the deployment mechanism may be a spring, such as a loop spring, a coiled spring, a leaf spring, a lever spring, or other compressible structures. The spring may be made of plastic, metal, foam, carpenter-type steel tape, copper, brellium, composite graphite, man made fibers, and so on. The type of material to be used may be selected based on the desired weight, fatigue resistance, cost, magnetic restrictions, etc. for a given application. In other embodiments, the deployment device may be implemented using ribs formed on the inner or outer sides of the concentrator walls.

In addition, as described above, the deployment device may be in the form of a superstructure deployed outside of the concentrators. The superstructure may be attached to the concentrator and may pull the concentrators into the deployed position. Other deployment actuators, such as, by way of example, linear actuators, fluid or hydraulic actuators, inflatable actuators, and/or rotating arm actuators, may be used as well.

Conventionally, when solar cell arrays panels are in the stowed position, they are spaced from one another sufficiently so as to avoid damage to the arrays which might be caused by vibration during launch. In one embodiment, this stowed array spacing is approximately 0.5 inches, though other spacings may be used as well. In one embodiment, the spacing may be between 0.25 inches and 1 inch. Advantageously, one embodiment of the concentrators of the present invention may be compressed to a height that is equal to or less than this conventional stowed array spacing. Thus, the stowed array spacing may be determined by launch vibration requirements, and not by the height of the concentrators.

Figure 2A:
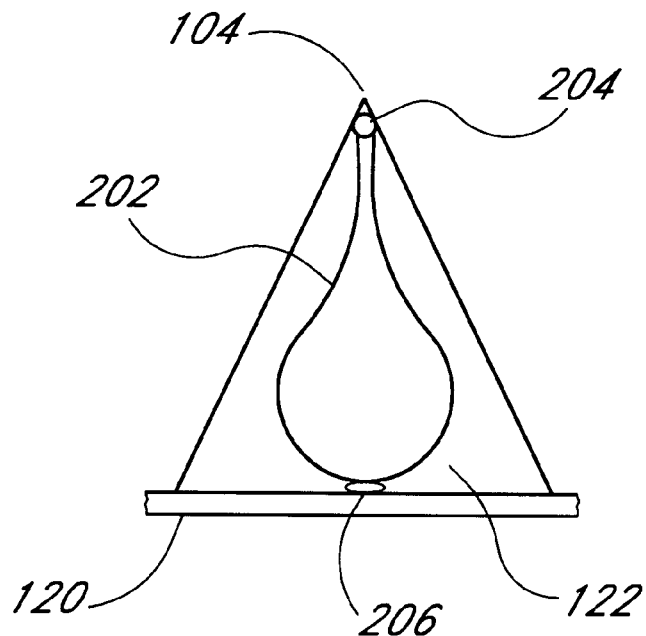
FIGS. 2A–2B illustrate a first embodiment of a deployment mechanism.
Figure 2B:
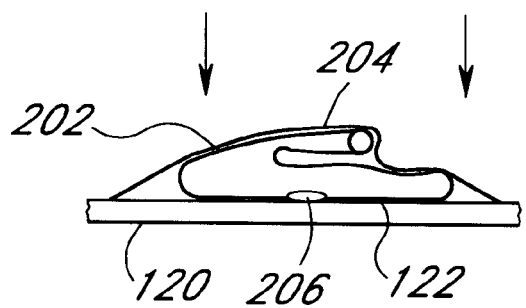

FIGS. 2A–2B illustrate a first embodiment of the deployment device 122. FIG. 2A illustrates this embodiment in the deployed position, while FIG. 2B illustrates this embodiment in the stowed position. In the illustrated example, a spring 202 in the form of a loop is used. The loop spring 202 is made of plastic, though other materials may be used as well. The loop spring 202 is bonded to the substrate 120 using glue 206 or other attachment mechanism. The glue may be a space-qualified, non-outgassing adhesive.

In one embodiment a spreader device 204 is attached to the top of the loop spring 202 and/or the concentrator thin film. In one embodiment, the spreader device 204 is a metal or rigid plastic rod that extends along the top or apex of the tent-like structure. The spreader device 204 helps keep the loop spring 202 properly centered, and helps ensure that both walls of the tent-like structure are kept taut. However, the spreader device is not essential, and may not be needed or used in some embodiments.

In the illustrated embodiment, the loop spring 202 pushes the spreader device 204 upwards so that the spreader 204 pushes up the concentrator all along the apex. The concentrator film is thus pulled taut, thereby providing substantially flat reflector walls and reducing wrinkles in the concentrator film to acceptable levels. Because, in one embodiment, each reflector wall is used to reflect light onto an adjacent or nearby column of solar cells, the presence of small wrinkles or distortions in the walls is not as critical as in many conventional designs, which need to reflect light over much greater distances.

As illustrated in FIG. 2B, when the concentrator 104 is in the compressed or stowed position, indicated by the down arrows, the loop spring flattens out to a relatively small height, such as 0.5 inches or less. Thus, multiple array panels incorporating the novel concentrator 104 can be just as efficiently stored as conventional array panels without concentrators.

FIGS. 3A–3B illustrate a second embodiment of the deployment device 122. FIG. 3A illustrates this embodiment in the deployed position, while FIG. 3B illustrates this embodiment in the stowed position. In the illustrated example, a spring 302 in the form of a coil is used. The coil spring 302 may be made of steel, though other materials may be used as well. The coil spring 302 is bonded to the substrate 120 using glue 306 or other types of attachment mechanisms. As with the loop spring 202, in one embodiment a spreader device 304 is attached to the top of the coil spring 302 using a retaining clip, glue, tape, or the like. In one embodiment, the spreader device 304 is a rod with a rounded or tapered top. The coil spring 302 pushes the spreader device 304 upwards so that the concentrator film is pulled into the desired shape.

As illustrated in FIG. 3B, when the concentrator 104 is in the compressed or stowed position the coil spring flattens out to a relatively small height, allowing for the efficient storage of the array panel.

FIGS. 4A–4B illustrate a third embodiment of the deployment device 122. FIG. 4A illustrates this embodiment in the deployed position, while FIG. 4B illustrates this embodiment in the stowed position. In the illustrated example, a spring 402 in the form of a leaf spring is used. The leaf spring 402 may be made of steel, though other materials may be used as well. The leaf spring 402 is bonded to the substrate 120 using glue 406 or other attachment mechanism. In one embodiment an extension device 404 is attached to the top of the leaf spring 402. The leaf spring 402 pushes the extension device 404 upwards, which in turn pushes the spreader device upwards to thereby deploy the concentrator 104.

As illustrated in FIG. 4B, when the concentrator 104 is in the compressed or stowed position the leaf spring flattens out to a relatively small height, allowing for the efficient storage of the array panel.

Figure 5:
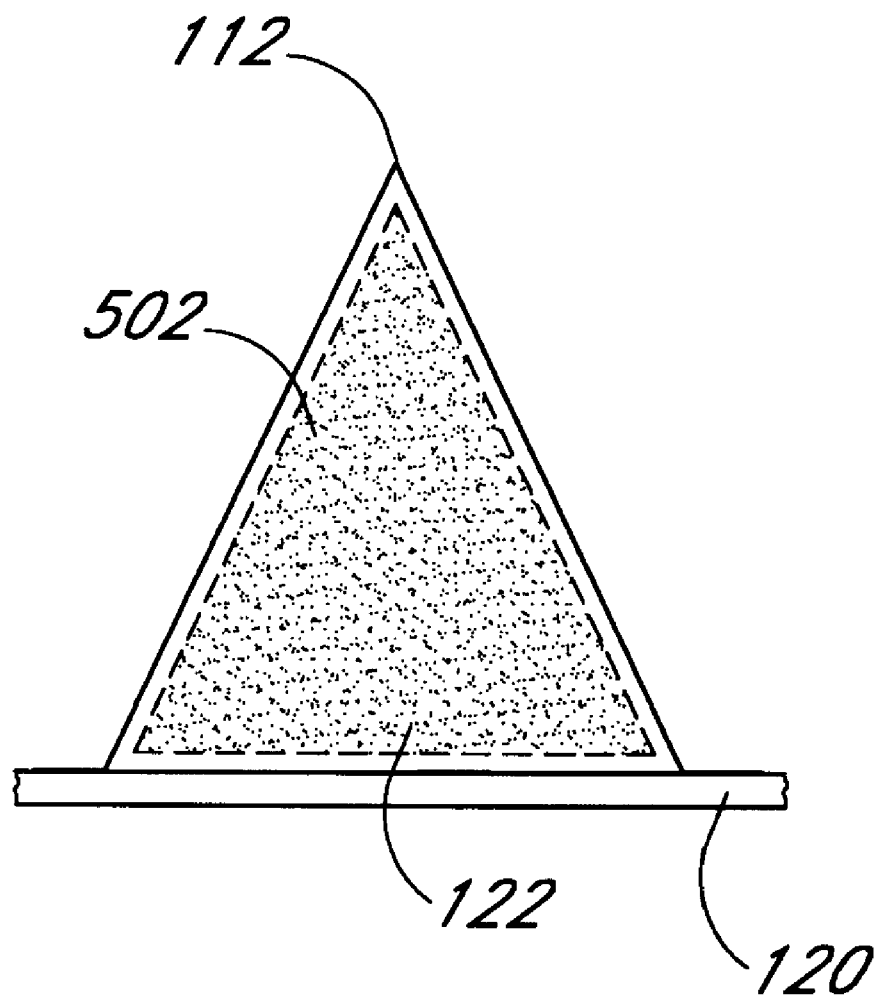
FIG. 5 illustrates a fourth embodiment of the deployment mechanism.

FIG. 5 illustrates another embodiment of the deployment device 122 in the deployed position. In the illustrated example, compressible foam 502 is used. The foam 502 may be formed from plastic. The foam 502 is bonded to the substrate 120 using glue or other mechanical attachment, or no attachment at all. In one embodiment a spreader device may be attached to the top of the foam 502 using a retaining clip, glue, tape, or the like. In another embodiment, the foam 502 extends all or a portion of the length of the concentrator and a spreader is not used. The foam 502 pushes upwards so that the concentrator film is pulled into the desired shape.

Figure 6:
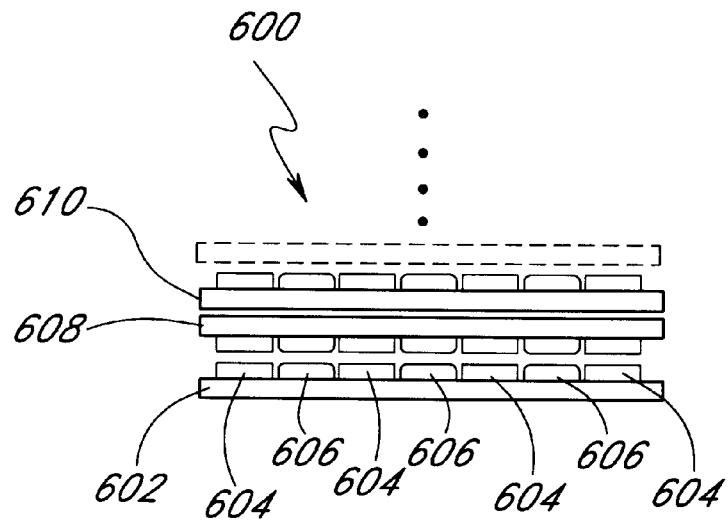
FIG. 6 illustrates solar rays incorporating one embodiment of the present invention.

FIG. 6 illustrates stowed solar cell arrays 602, 608, 610 incorporating one embodiment of the present invention. The arrays 602, 608, 610 include columns or strings 604 of solar cells alternating with columns 606 of concentrators. The concentrators are compressed by the weight of the arrays. The arrays 602, 608, 610 are coupled to a spacecraft, such as a satellite, using hinges or other attachment devices. As can be seen, the arrays 602, 608, 610 may advantageously be closely packed together.

Figure 7A:
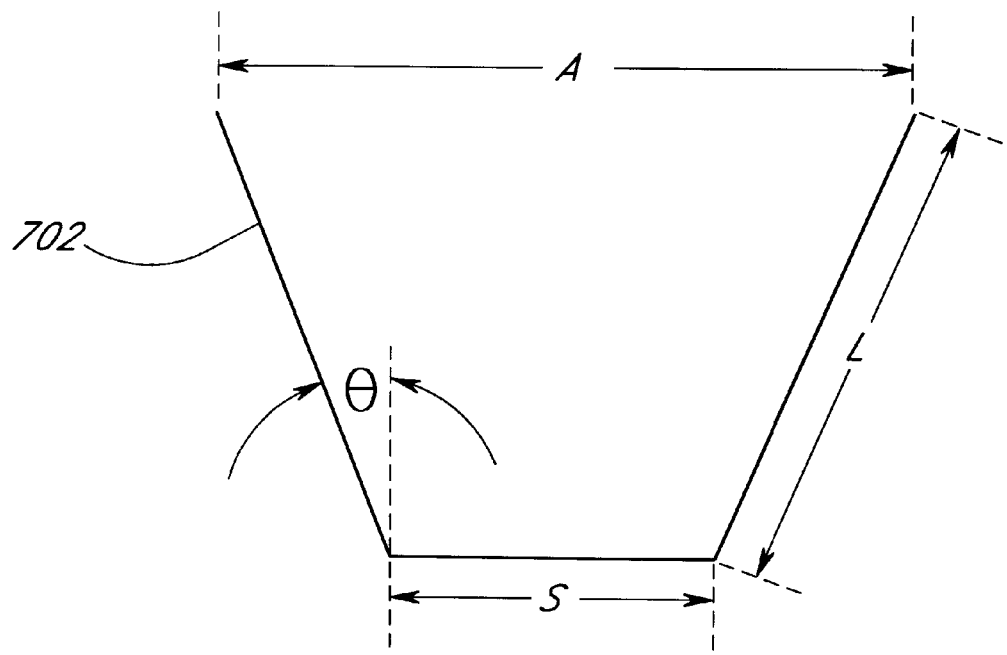
FIGS. 7A, 7B and 7C illustrate tradeoffs using exemplary dimensional ratios.
Figure 7B:
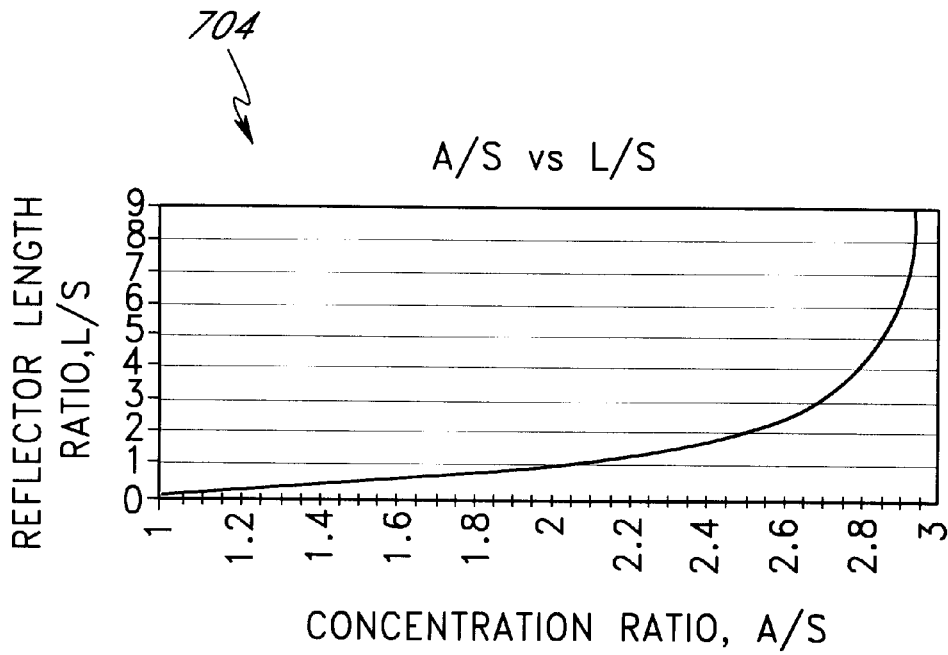
Figure 7C:
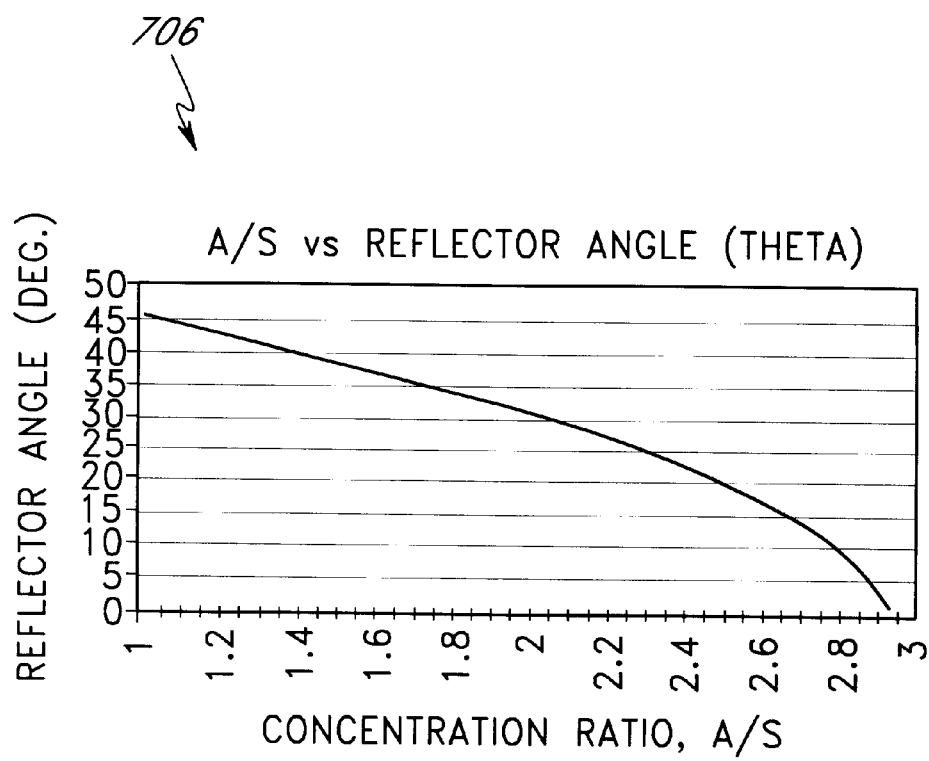

FIGS. 7A, 7B and 7C illustrate the effect different dimensional ratios can have on the concentration ratio. A representation of a trough 702 formed by two concentrator walls and a solar cell is used to define various geometrical ratios. The dimension "A" is the width at the top of the trough 702. The dimension "S" is the width at the bottom of the trough 702. The dimension "L" is the length of the trough wall. The reflector angle θ is the angle formed by the vertical to the bottom wall and the side wall. Graph 704 illustrates the effect that changes in the reflector length ratio (L/S) can have on the concentration ratio (A/S). In one embodiment, a concentration ratio of approximately 2.5 is selected, because a greater concentration ratio requires an exponentially, or almost exponential greater ratio of L/S, resulting in either much higher concentrators or much small solar cells. However, in other embodiments a greater concentration ratio, such as 2.9 may be selected using a configuration with a greater length ratio or by using curved or parabolic reflectors and the like. In still another embodiment, a concentrator ratio of 2 may be provided.

Similarly, graph 706 illustrates the effect that changes in the reflector angle θ can have on the concentration ratio (A/S). In one embodiment, a concentration ratio of approximately 2.5 is selected, with a reflector angle θ of approximately 22°. Of course, other reflector angles may be used as well.

In one embodiment, the solar cells 110 are space qualified with a single-crystal silicon design. However, other technologies, including GaAs/Ge and multijunction solar cells, can be used as well. In one embodiment, the materials and the cell are optimized for performance in an AM0 spectrum (the spectrum found at Earth's orbit around the sun, outside of Earth's atmosphere) and the space radiation environment. A shallow junction N on P silicon structure which provides satisfactory radiation resistance may be used. For extraterrestrial applications, space qualified, Czochralski grown, boron doped, single-crystal silicon with a base resistivity of 1–3 ohm-cm may be used, thought other materials with other resistivities may be used as well.

Thus, in one embodiment of the present invention, a solar array may be constructed using compressible, light weight concentrators that are distributed between strings of radiation tolerant solar cells. The novel compressible concentrator configuration may "pop-up" during panel deployment, thereby reducing or eliminating the need for off-panel storage areas and/or other heavy, complex and unreliable deployment mechanisms.

While certain preferred embodiments of the invention have been described, these embodiments have been presented by way of example only, and are not intended to limit the scope of the present invention. Accordingly, the breadth and scope of the present invention should be defined only in accordance with the following claims and their equivalents.

What is claimed is:

1. A solar cell array intended for use in space, said solar cell array including a lightweight, modular, compressible concentrator apparatus which can be efficiently deployed, said solar cell array comprising:
   a first column of solar cells;
   a second column of solar cells;
   a first reflective concentrator positioned between said first column of solar cells and said second column of solar cells, said reflective concentrator including a thin film material, wherein said reflective concentrator is compressible to a first height when in the stowed position; and
   a spring coupled to said concentrator, wherein said spring urges said reflective concentrator to a second height when said reflective concentrator is deployed.

2. The solar cell array as defined in claim 1, where said first reflective concentrator is triangularly shaped when deployed.

3. The solar cell array as defined in claim 2, further comprising a spreader device coupled to an apex of said first reflective concentrator to thereby reduce wrinkles and deformations.

4. The solar cell array as defined in claim 1, where said thin film material extends at least partly under said first column of solar cells.

5. The solar cell array as defined in claim 1, further comprising:
   a third column of solar cells; and
   a second reflective concentrator positioned between said second column of solar cells and said third column of solar cells.

6. The solar cell array as defined in claim 1, further comprising a second reflective concentrator positioned adjacent to said second column of solar cells opposite said first reflective concentrator, wherein said second reflective concentrator only reflects light off one side.

7. The solar cell array as defined in claim 1, further comprising:
   a third column of solar cells; and
   a second reflective concentrator positioned between said second column of solar cells and said third column of solar cells, wherein said first reflective concentrator and said second reflective concentrator are spaced and sized to provide a concentration ratio of at least 2.0.

8. The solar cell array as defined in claim 1, further comprising:
   a third column of solar cells; and
   a second reflective concentrator positioned between said second column of solar cells and said third column of solar cells, wherein said first reflective concentrator has a first wall used to reflect light on at least a portion of said second column of solar cells, and said second reflective concentrator has a second wall which reflects light on at least a portion of said second column of solar cells, wherein a ratio of a distance of an apex span between said first reflective concentrator and said second reflective concentrator and a length of said first wall is at least 2.

9. The solar cell array as defined in claim 1, where said thin film material extends at least partly under said spring.

10. The solar cell array as defined in claim 1, where said spring is a loop spring.

11. The solar cell array as defined in claim 1, where said spring is a coil spring.

12. The solar cell array as defined in claim 1, where said spring is a leaf spring.

13. The solar cell array as defined in claim 1, where said spring is at least partly formed by a compressible foam material.

14. The solar cell array as defined in claim 1, where said first reflective concentrator is compressible to less than one inch in height.

15. The solar cell array as defined in claim 1, where said first reflective concentrator is compressible to less than half an inch in height.

16. A method of assembling a solar cell array, said method comprising:
   providing a first column of solar cells on an array panel;
   providing a second column of solar cells on said array panel; and
   providing a reflective concentrator apparatus formed at least partly from thin film material, said reflective concentrator apparatus positioned between said first column of solar cells and said second column of solar cells, wherein said reflective concentrator apparatus is compressible to a first height for stowing and said reflective concentrator apparatus extends to a second height for deployment.

17. The method of assembling a solar cell array as defined in claim 16, further comprising disposing a spring within said reflective concentrator apparatus, wherein said spring causes said reflective concentrator apparatus to extend to said second height for deployment.

18. The method of assembling a solar cell array as defined in claim 16, further comprising coupling a coil spring to said reflective concentrator apparatus, wherein said coil spring causes said reflective concentrator apparatus to extend to said second height for deployment.

19. The method of assembling a solar cell array as defined in claim 16, further comprising coupling a deployment device to said reflective concentrator apparatus, wherein said deployment device causes said reflective concentrator apparatus to extend to said second height for deployment.

20. The method of assembling a solar cell array as defined in claim 16, further comprising affixing at least a portion of said thin film material under at least a portion of said first column of solar cells.

21. The method of assembling a solar cell array as defined in claim 16, further comprising attaching said reflective concentrator apparatus to a solar cell array substrate.

22. The method of assembling a solar cell array as defined in claim 16, further comprising attaching said reflective concentrator apparatus to a thin film overlaying a solar cell array substrate.

23. The method of assembling a solar cell array as defined in claim 16, wherein said reflective concentrator apparatus is tent-shaped.

24. The method of assembling a solar cell array as defined in claim 16, wherein at least one side of said reflective concentrator apparatus is shaped like a right triangle.

25. The method of assembling a solar cell array as defined in claim 16, wherein said solar cell array includes a rigid substrate.

26. The method of assembling a solar cell array as defined in claim 16, wherein said solar cell array includes a flexible substrate.

27. The method of assembling a solar cell array as defined in claim 16, wherein said thin film material is polymide.

28. The method of assembling a solar cell array as defined in claim 16, wherein said thin film material is fluorocarbon.

29. The method of assembling a solar cell array as defined in claim 16, wherein said thin film material includes a fiberglass backing.

30. The method of assembling a solar cell array as defined in claim 16, wherein said thin film material includes a mesh backing.

31. A solar cell array, comprising:
   a first means for converting solar energy into electrical energy, including a plurality of solar cells;
   a second means for converting solar energy into electrical energy, including a plurality of solar cells;
   a reflective means for concentrating light on said first means for converting solar energy and said second means for converting solar energy, said reflective means for concentrating light positioned between said first means for converting solar energy and said second means for converting solar, wherein said reflective means for concentrating light is compressible to a first height and is extendible to a second height.

32. The solar cell array as defined in claim 31, further comprising a means for urging said reflective means for concentrating light from said first height to said second height.

33. The solar cell array as defined in claim 31, further comprising a means for compressing said reflective means for concentrating light from said second height to said first height.

34. The solar cell array as defined in claim 31, where said reflective means for concentrating light pops up during array deployment.

35. The solar cell array as defined in claim 31, further comprising an array substrate.

36. A system intended for use in space comprising:
   a first string of solar cells on a panel;
   a second string of solar cells on said panel; and
   a concentrator, said concentrator positioned between said first string of solar cells and said second string of solar cells, said concentrator having a tent shape with a first height when deployed and said concentrator having a second height when stowed, where said first height is greater than said second height.

37. A system intended for use in space comprising:
   a first column of solar cells on a first array panel;
   a second column of solar cells on said first array panel; and
   a thin film concentrator, said thin film concentrator positioned between said first column of solar cells and said second column of solar cells, said thin film concentrator having a first height when deployed;

a second array panel which compresses said thin film concentrator to a second height when in a stowed position, where said first height is greater than said second height; and a space vehicle coupled to said first array panel and said second array panel.

38. The system intended for use in space as defined in claim 37, further comprising a deployment device which causes said thin film concentrator to be deployed to said first height.

39. The system intended for use in space as defined in claim 37, further comprising a spring which causes said thin film concentrator to be deployed to said first height.

40. The system intended for use in space as defined in claim 37, wherein said second height is approximately half an inch.

41. The system intended for use in space as defined in claim 37, said thin film concentrator has a tent shape when deployed.

* * * * *